United States Patent
Kwon et al.

(10) Patent No.: US 8,570,077 B2
(45) Date of Patent: Oct. 29, 2013

(54) METHODS AND IMPLEMENTATION OF LOW-POWER POWER-ON CONTROL CIRCUITS

(75) Inventors: Chang Ki Kwon, San Diego, CA (US); Craig E. Borden, Placentia, CA (US); Steve J. Halter, San Diego, CA (US); Tirdad Sowlati, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 183 days.

(21) Appl. No.: 12/971,527

(22) Filed: Dec. 17, 2010

(65) Prior Publication Data

US 2012/0153994 A1 Jun. 21, 2012

(51) Int. Cl.
*H03L 7/00* (2006.01)

(52) U.S. Cl.
USPC .......................... 327/143; 327/198

(58) Field of Classification Search
USPC .......................... 327/142, 143, 198
See application file for complete search history.

(56) References Cited

U.S. PATENT DOCUMENTS

| | | | |
|---|---|---|---|
| 4,812,680 A * | 3/1989 | Kawashima et al. | 327/97 |
| 5,345,422 A | 9/1994 | Redwine | |
| 6,201,437 B1 * | 3/2001 | Kono et al. | 327/545 |
| 6,281,716 B1 * | 8/2001 | Mihara | 327/80 |
| 6,297,683 B1 * | 10/2001 | Drapkin et al. | 327/333 |
| 6,335,637 B1 | 1/2002 | Correale, Jr. et al. | |
| 6,388,469 B1 * | 5/2002 | Hunt et al. | 326/81 |
| 6,535,435 B2 * | 3/2003 | Tanaka et al. | 365/189.09 |
| 6,566,931 B2 * | 5/2003 | Higuchi | 327/333 |
| 6,788,511 B1 | 9/2004 | Bikulcius et al. | |
| 6,885,605 B2 | 4/2005 | Lee et al. | |
| 7,030,682 B2 * | 4/2006 | Tobita | 327/536 |
| 7,123,033 B1 * | 10/2006 | Wright | 324/713 |
| 7,307,454 B1 * | 12/2007 | Wert | 326/63 |
| 7,489,167 B2 * | 2/2009 | Goh | 327/143 |
| 7,541,835 B1 | 6/2009 | Shaikh et al. | |
| 7,605,618 B2 * | 10/2009 | Srinivas et al. | 327/108 |
| 7,619,444 B1 | 11/2009 | Shaikh et al. | |
| 2003/0223166 A1 | 12/2003 | Chen et al. | |
| 2003/0225566 A1 | 12/2003 | O'brein et al. | |
| 2005/0195000 A1 * | 9/2005 | Parker et al. | 327/143 |
| 2007/0103215 A1 | 5/2007 | Boerstler et al. | |
| 2007/0188202 A1 * | 8/2007 | Kuo | 327/142 |
| 2010/0194200 A1 | 8/2010 | Kwon et al. | |
| 2010/0229036 A1 | 9/2010 | Goyal et al. | |
| 2011/0032019 A1 * | 2/2011 | Saether | 327/333 |

FOREIGN PATENT DOCUMENTS

WO WO2005057628 A2 6/2005

OTHER PUBLICATIONS

International Search Report and Written Opinion—PCT/US2011/065696—ISAEPO—Apr. 27, 2012.

* cited by examiner

*Primary Examiner* — William Hernandez
(74) *Attorney, Agent, or Firm* — Sam Talpalatsky; Nicholas J. Pauley; Joseph Agusta

(57) ABSTRACT

Methods and implementation of low-power power-on control circuits are disclosed. In a particular embodiment, an apparatus includes a power detector circuit powered by a first voltage supply. At least one voltage level-shifting device is coupled to a second voltage supply and a test input is provided to the power detector circuit. An optional leakage self-control device may reduce unwanted leakage currents associated with the first supply and the second supply.

29 Claims, 10 Drawing Sheets

METHODS AND IMPLEMENTATION OF LOW-POWER POWER-ON CONTROL CIRCUITS

I. FIELD

The present disclosure is generally related to power-on control circuits.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, an electronic device can include significant computing capabilities.

The electronic device may include several electronic components designed to communicate with one another. Each of the electronic components may correspond to one of a plurality of voltage domains, such as a pad voltage domain and a core voltage domain. Conventional voltage detectors may detect whether the core voltage domain is at a sufficient voltage for operation of core circuitry. However, such conventional voltage detectors may be powered by the pad voltage domain or may be inoperable when the pad voltage domain is at an insufficient voltage. Thus, conventional voltage detectors may be unable to detect a state in which the core voltage domain is powered while the pad voltage domain is not powered.

III. SUMMARY

A low-power power-on control circuit may be configured to detect a voltage state of a first voltage domain and provide an output indicating the state of the first voltage domain to an electronic component residing at a second voltage domain. The low-power power-on control circuit may be used during a debugging procedure, such as during a Joint Test Action Group (JTAG) boundary scan, in which physical interfaces of a semiconductor device are tested. For example, it may be desirable to determine whether a pad voltage supply associated with boundary logic of the semiconductor device is sufficiently powered during the JTAG boundary scan. The low-power power-on control circuit may provide a test input that indicates whether the pad voltage supply is sufficiently powered. The test input may be used to provide a reset signal to JTAG logic (e.g. a test access port (TAP) controller) to place the boundary logic in a desirable state (e.g. a bypass state) according to the determined state of the pad voltage supply. The low-power power-on control circuit may be powered by the core voltage domain and may therefore be able to provide a proper reset signal to core logic while the pad voltage domain is not receiving power.

In another particular embodiment, an apparatus includes a power detector circuit powered by a first voltage supply. At least one voltage level-shifting device is coupled to a second voltage supply and provides a test input to the power detector circuit.

In another particular embodiment, an apparatus includes means for detecting voltages. The means for detecting voltages is powered by a first voltage supply. The apparatus further includes means for level-shifting (e.g. stepping down) voltages. The means for level-shifting voltages is coupled to a second voltage supply and provides a test input to the means for detecting voltages responsive to the second voltage supply.

In another particular embodiment, a method includes powering a power detector circuit by a first voltage supply and receiving at a voltage level-shifting device a voltage from a second voltage supply. The method further includes providing, by the voltage level-shifting device, a test input to the power detector circuit.

In another particular embodiment, a power-on control circuit includes a power detector circuit coupled to a core voltage supply. A voltage level-shifting device is coupled to a pad voltage supply and to the power detector circuit. A buffer stage is coupled to the power detector circuit and to the core voltage supply and provides an output indicating a state of the pad voltage supply.

In another particular embodiment, a computer readable tangible medium stores instructions executable by a computer. The instructions include instructions that are executable by the computer to determine whether a power detector circuit powered by a first voltage supply has received a test input from at least one voltage level-shifting device coupled to a second voltage supply.

In another particular embodiment, a power-on control circuit includes a power detector circuit coupled to a core voltage supply and a voltage level-shifting device coupled to a pad voltage supply and to the power detector circuit. A buffer stage is coupled to the power detector circuit and to the core voltage supply. The buffer stage is configured to provide an output indicating a state of the pad voltage supply.

One particular advantage provided by at least one of the disclosed embodiments is that a state of a first voltage domain may be determined and indicated to a second voltage domain even if the first voltage domain is not receiving power. Another particular advantage provided by at least one of the disclosed embodiments is that determining the state of the first voltage domain may reduce power consumption, e.g. by use of a level-shifting device or an optional leakage control device. Another particular advantage provided by at least one of the disclosed embodiments is compliance with standards promulgated by the Institute of Electrical and Electronics Engineers (IEEE), e.g. IEEE 1149.1 by providing to JTAG logic devices an output that indicates a power supply level associated with system boundary logic and thus enabling the JTAG logic devices to selectively scan or bypass the boundary logic.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
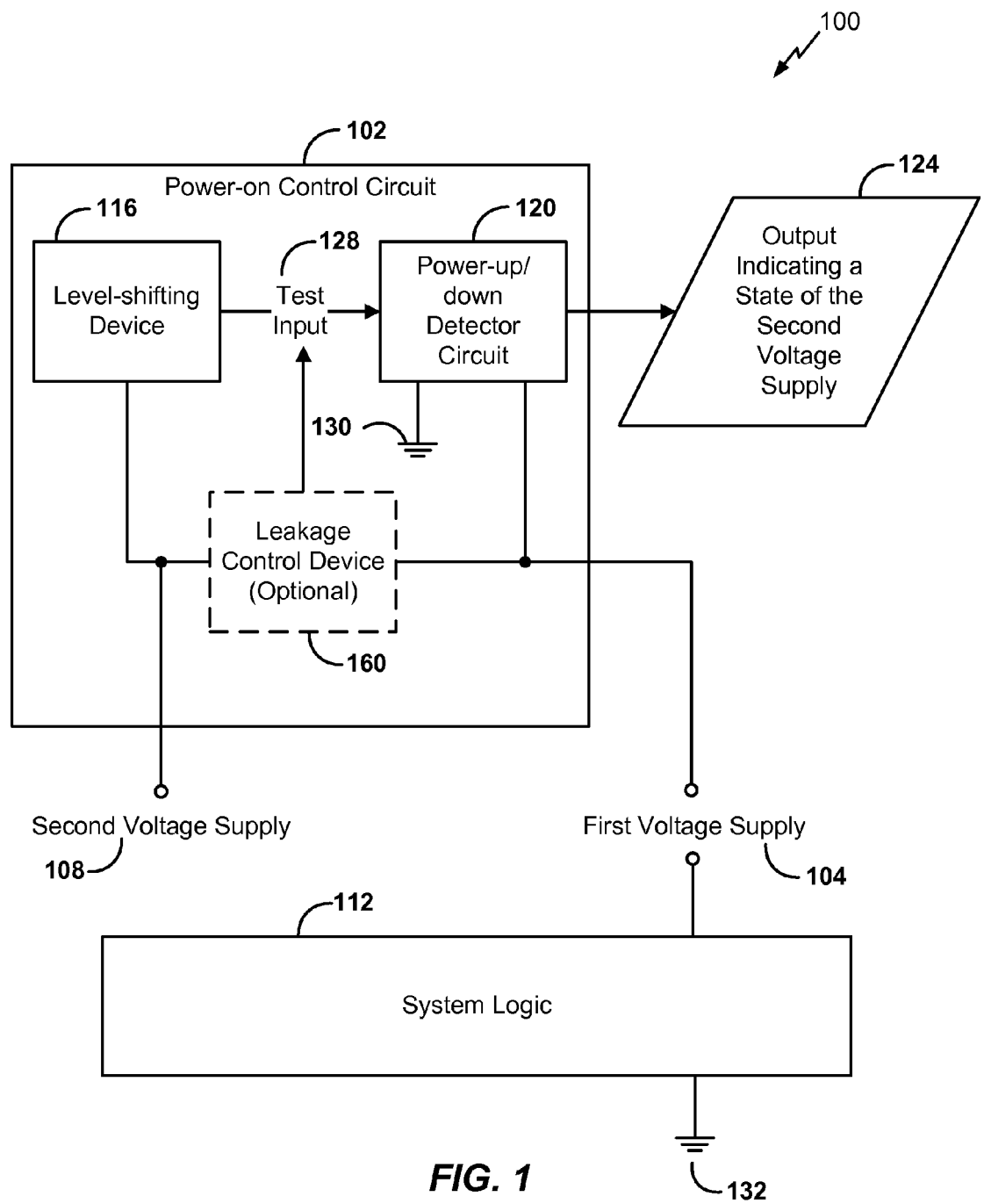
FIG. 1 is a diagram of a particular illustrative embodiment of a system including a power-on control circuit.

Referring to FIG. 1, a particular illustrative embodiment of a system including a power-on control circuit 102 is disclosed and generally designated 100. The system 100 includes a first voltage supply 104 and a second voltage supply 108. The system 100 also includes system logic 112 coupled to the power-on control circuit 102. The power-on control circuit 102 further includes a level-shifting device 116, a power detector circuit (alternatively referred to and illustrated in FIG. 1 as a power up/down detector circuit 120), and an optional leakage self-control circuit 160.

The first voltage supply 104 may supply power or voltage to the system logic 112. The first voltage supply 104 may also supply power or voltage to the power detector circuit 120. The second voltage supply 108 may supply power or voltage to the level-shifting device 116. The first voltage supply 104 and the second voltage supply 108 may generally be of any voltage level. In a particular illustrative embodiment, the first voltage supply 104 is a core voltage supply and the second voltage supply 108 is a pad voltage supply.

Various devices of the system 100 may be coupled to a ground voltage or to a ground node. For example, the system logic 112 may be coupled to a ground node 132. The power detector circuit 120 may be coupled to a ground node 130. The ground node 132 may be the same as the ground node 130 or may be different (e.g. ground level-shifting devices or back-to-back electrostatic discharge (ESD) protection diodes may be coupled between the ground nodes 130, 132).

According to a particular illustrative embodiment, the power-on control circuit 102 includes a leakage control device 160. The leakage control device 160 may be included within the power-on control circuit 102 or may be external to the power-on control circuit 102. The leakage control device 160 may be coupled to the first voltage supply 104 and to the second voltage supply 108. The leakage control device 160 may be configured to reduce leakage currents associated with one or both of the first voltage supply 104 and the second voltage supply 108, as will be described herein with reference to FIG. 5.

In operation, the level-shifting device 116 may receive a voltage from the second voltage supply 108. The level-shifting device 116 may step down or attenuate the voltage received from the second voltage supply 108. Based on the voltage received from the second voltage supply 108, the level-shifting device 116 may provide a test input 128 to the power detector circuit 120. The power detector circuit 120 may reference the test input 128 and may provide an output 124 indicating a state of the second voltage supply 108 (e.g. whether the second voltage supply 108 is powered). The output 124 may be provided to various components. For example, the output 124 may be provided to components of the system 100 such as the system logic 112. The output 124 may further be provided to a test access port (TAP) controller, as will be described herein with reference to FIG. 6.

As will be appreciated, the system 100 may facilitate exchange of state information between voltage domains of a system, including when one or more of the voltage domains are not powered. For example, the power detector circuit 120 may provide the output 124 indicating a state of the second voltage supply 108 even when the second voltage supply 108 is not powered, since the power detector circuit 120 may be powered by the first voltage supply 104. Therefore, an acceptable operating state of the system 100 may include a state in which the first voltage supply 104 is supplied with voltage and the second voltage supply 108 is not supplied sufficiently.

Figure 2:
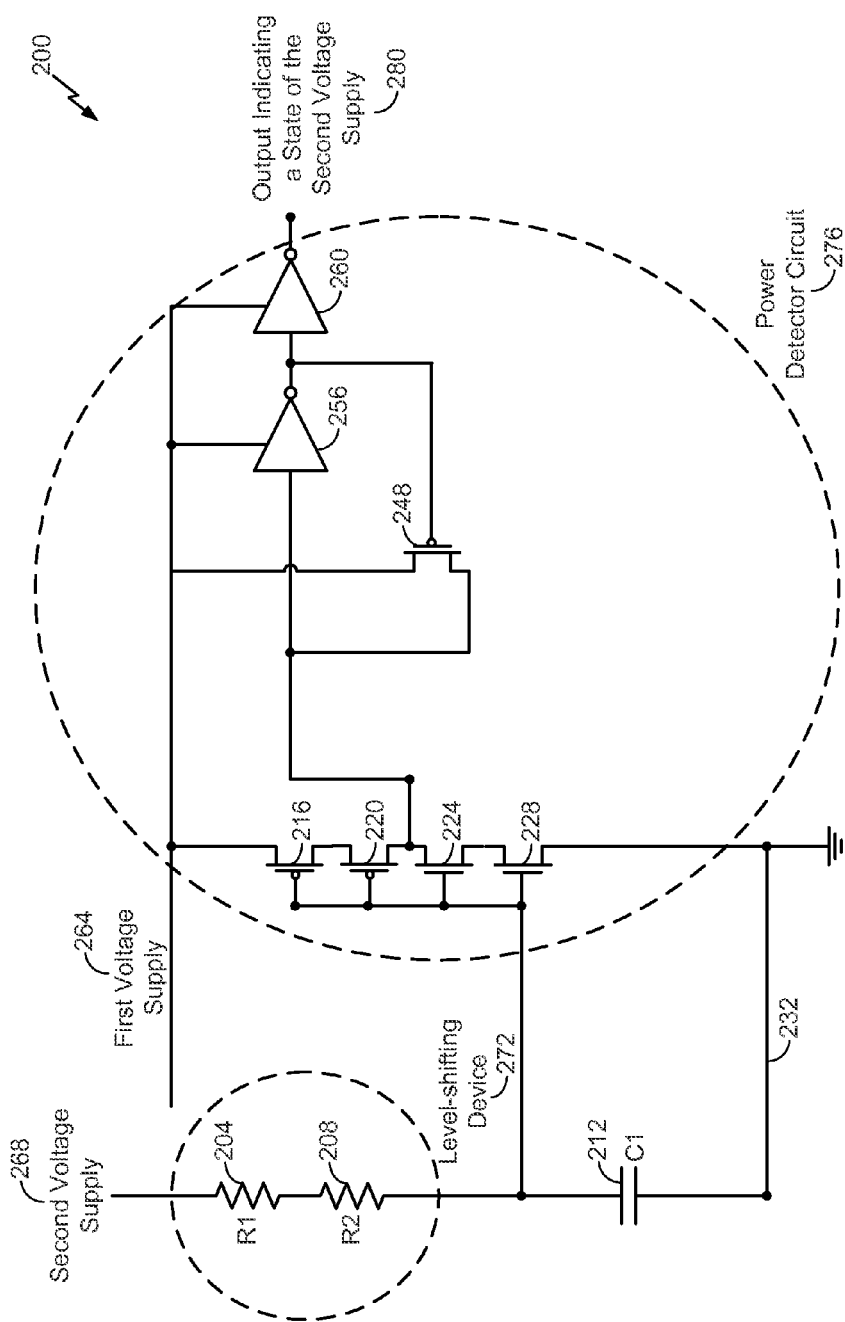
FIG. 2 is a circuit diagram of a particular illustrative embodiment of the power-on control circuit of FIG. 1.

Referring to FIG. 2, a particular illustrative embodiment of a power-on control circuit is disclosed and generally designated 200. The power-on control circuit 200 may be implemented into the system 100 of FIG. 1 as the power-on control circuit 102 of FIG. 1.

In a particular embodiment, the power-on control circuit 200 includes a power detector circuit 276 and a level-shifting device 272. The power detector circuit 276 may be coupled to a first voltage supply 264. The level-shifting device 272 may be coupled to a second voltage supply 268 and to a capacitor 212. The capacitor 212 and the power detector circuit 276 may be coupled to a ground node 232.

The capacitor 212, the first resistor 204, and the second resistor 208 may form a low-pass filter circuit. An RC time constant associated with the low-pass filter circuit may determine a behavior of the test input provided to the power detector circuit 276 (i.e. how quickly or how slowly the test input is increased or decreased in response to a change in the second voltage supply 268).

The power detector circuit 276 may be coupled to the level-shifting device 272.

The level-shifting device 272 may comprise a plurality of resistors or resistances. For example, the level-shifting device 272 may include two resistors, such as a first resistor 204 and a second resistor 208. As will be appreciated, the level-shifting device 272 may include any device capable of attenuating or stepping down a voltage.

The power detector circuit 276 may include a plurality of transistors. For example, the power detector circuit 276 may include a first p-type metal-oxide semiconductor transistor (PMOS) 216. The first PMOS 216 may be coupled to the first voltage supply 264, to the level-shifting device 272, to a second PMOS 220, to a first n-type metal-oxide semiconductor transistor (NMOS) 224, and to a second NMOS 228.

The first inverter 256 may be coupled to the first voltage supply 264. An output of the first inverter 256 may be coupled to a second inverter 260, which may be coupled to the first voltage supply 264. The second inverter 260 may provide an output 280 indicating a state of the second voltage supply 268.

The output of the first inverter 256 may be coupled to a third PMOS 248. The third PMOS 248 may be coupled to the first voltage supply 264.

In operation, the level-shifting device 272 may receive a voltage from the second voltage supply 268. The level-shifting device 272 may step down or attenuate the voltage from the second voltage supply 268 and in response provide a test input to the power detector circuit 276, i.e. the power detector circuit 276 may reference the test input to determine a state of the second voltage supply 268.

The level-shifting device 272 may introduce the test input to the first PMOS 216, to the second PMOS 220, to the first NMOS 224, and to the second NMOS 228. In a particular embodiment, the first PMOS 216, the second PMOS 220, the first NMOS 224, and the second NMOS 228 comprise an inverter circuit configured to invert the test input provided by the level-shifting device 272.

For example, if the second voltage supply 268 is not receiving power, then the test input provided to the power detector circuit 276 may be a low voltage. If the first voltage supply 264 is receiving power, then the first PMOS 216 and the second PMOS 220 may pull up a voltage at the drains of the second PMOS 220 and the first NMOS 224 (i.e. invert the test input).

Alternatively, if the second voltage supply 268 is receiving power, then the test input provided to the power detector circuit may be a high voltage. The high voltage may activate the gates of the first NMOS 224 and the second NMOS 228 and allow the first NMOS 224 and the second NMOS 228 to pull down a voltage at the drain of the first NMOS 220 (i.e. invert the test input).

The inverted test input may be introduced to the first inverter 256. The first inverter 256 may generate a signal to be provided to the second inverter 260. The second inverter 260 may generate an output 280 indicating a state of the second voltage supply 268. The first inverter 256 and the second inverter 260 may in combination function as a buffer stage of the power detector circuit 276.

As will be appreciated, the power-on control circuit 200 may allow for detection of a state of the second voltage supply 268 while the second voltage supply 268 is not receiving power, since the power detector circuit 276 may be powered by the first voltage supply 264. Accordingly, the power detector circuit 276 may be operable to detect power while the second voltage supply 268 is not powered. Therefore, the power-on control circuit 200 may provide the output 280 indicating a state of the second voltage supply 268 when the second voltage supply 268 is not receiving power.

As will also be appreciated, the output 280 indicating a state of the second voltage supply 268 may comprise a logical level. In a particular illustrative embodiment, if the first voltage supply 264 exceeds a first threshold voltage and the second voltage supply 268 exceeds a second threshold voltage, the output 280 will be low. If the second voltage supply 268 transitions between high/low or low/high states while the first voltage supply 264 is receiving power (i.e. while the power detector circuit 276 is receiving power from the first voltage supply 264), the output 280 may change logical levels to indicate the state of the second voltage supply 268, as will be explained further in reference to FIG. 7.

Figure 3:
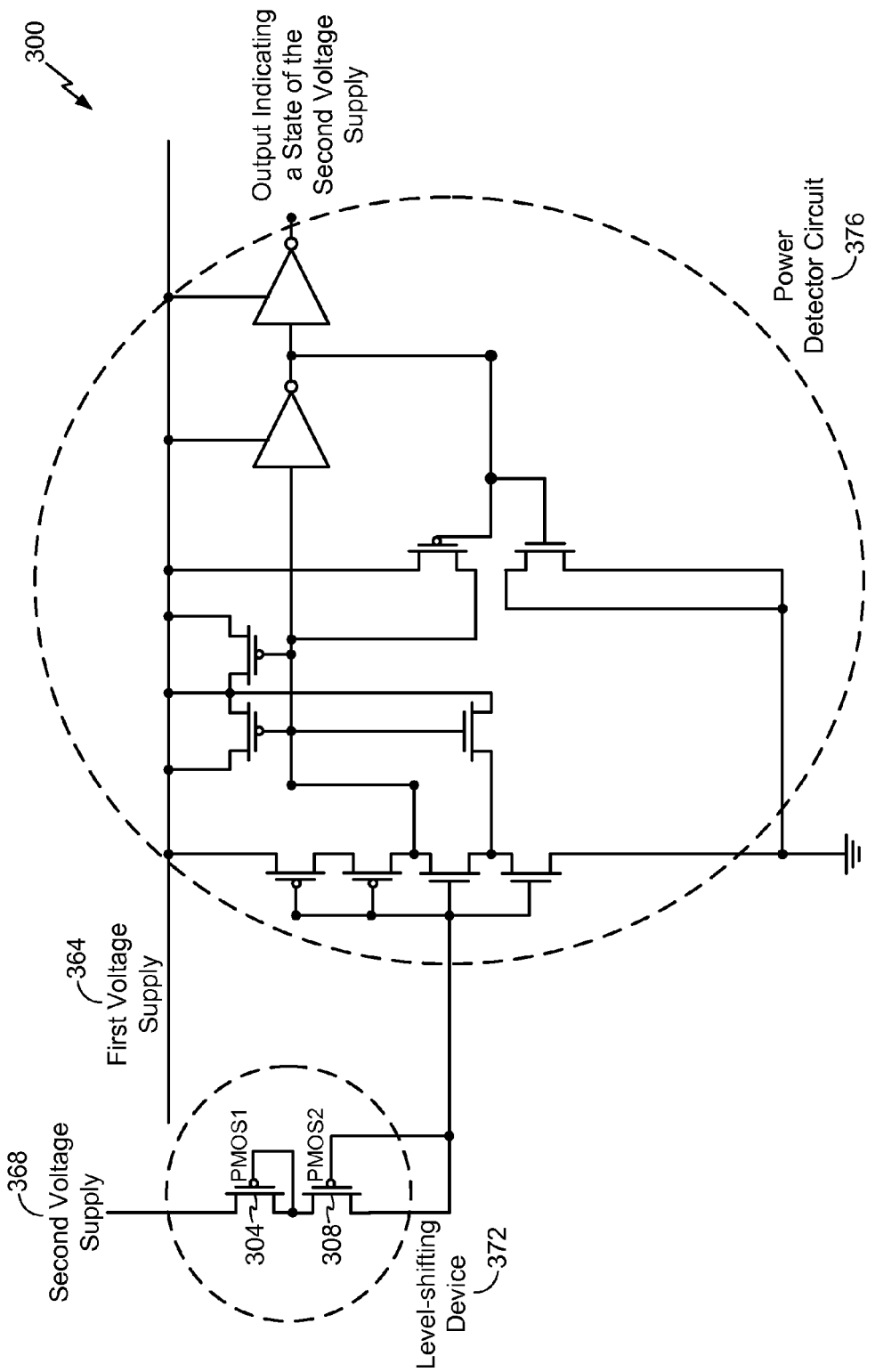
FIG. 3 is a circuit diagram of another particular illustrative embodiment of the power-on control circuit of FIG. 1.

Referring to FIG. 3, a particular illustrative embodiment of a power-on control circuit is disclosed and generally designated 300. The power-on control circuit 300 may be implemented into the system 100 of FIG. 1 as the power-on control circuit 102 of FIG. 1. Components of the power-on control circuit 300 may correspond to components of the power-on control circuit 200 of FIG. 2.

The power-on control circuit 300 may include a level-shifting device 372 configured to receive a voltage from a second voltage supply 368, step down the voltage received from the second voltage supply 368, and provide a test input to a power detector circuit 376. In a particular illustrative embodiment, the level-shifting device 372 includes a first PMOS 304 and a second PMOS 308. The first PMOS 304 and the second PMOS 308 may be coupled as diodes, i.e. with a gate and a drain of the first PMOS 304 coupled to a source of the second PMOS 308. The level-shifting device 372 may include any number of diodes or diode-coupled transistors. In a particular illustrative embodiment, the level-shifting device 372 includes a number of diodes that is proportional to the difference between the voltage of the second voltage supply 368 and a first voltage supply 364 (i.e. the number of diodes may be selected based on the difference between the voltage of the second voltage supply 368 and the voltage of the first voltage supply 364).

In operation, the level-shifting device 372 may utilize voltage drops associated with the first PMOS 304 and the second PMOS 308 to step down a voltage received from the second voltage supply 368. For example, the second voltage supply 368 may be maintained at a voltage of around 1.8 volts (V). The first voltage supply 364 may be maintained at a voltage of around 1.2 V. The level-shifting device 372 may use a first voltage drop of around 0.3 V associated with the first PMOS 304 and a second voltage drop of around 0.3 V associated with the second PMOS 308 to step down the voltage of the second voltage supply 368 from about 1.8 V to the voltage of the first voltage supply 364 of about 1.2 V.

As will be appreciated, the power-on control circuit 300 may provide a test input that is stepped down even while the second voltage supply 368 is in the steady state. For example, the test input provided to the power detector circuit 376 may be stepped down based on a constant voltage drop associated with each diode rather than based on a current through the level-shifting device 372 (e.g. a current through one or more resistors). Therefore, a path from the level-shifting device 372 to ground need not exist to provide a stepped down voltage, since diode-coupled transistors are utilized. The level-shifting device 372 may be useful if an RC circuit is not desired in the power-on control circuit 300 (e.g. given the same area, if a ramp-up time up to a threshold voltage associated with the second voltage supply 368 could be greater than the RC time constant associated with the RC circuit of the power-on control circuit 200 of FIG. 2).

Figure 4:
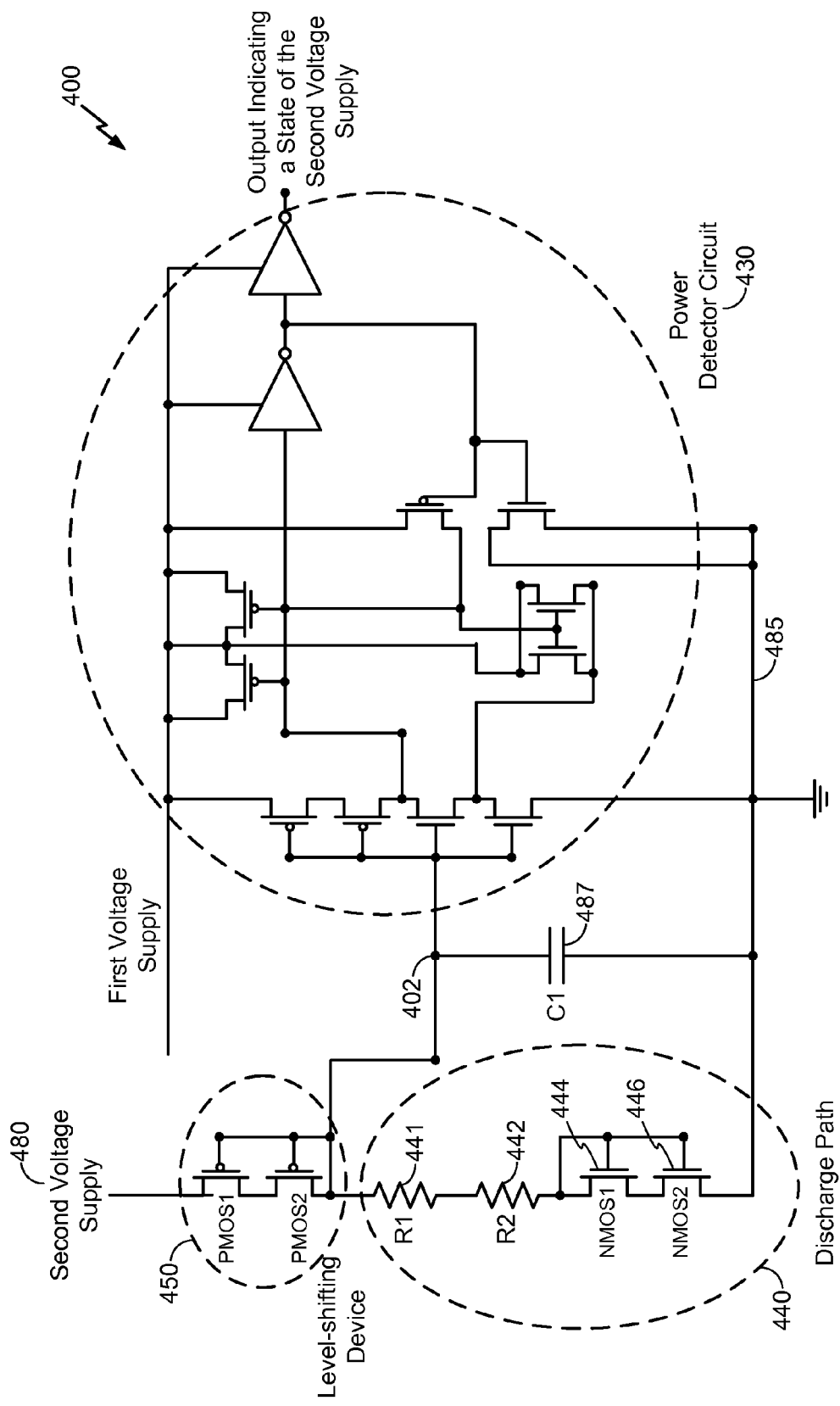
FIG. 4 is a circuit diagram of another particular illustrative embodiment of the power-on control circuit of FIG. 1.

Referring to FIG. 4, a particular illustrative embodiment of a power-on control circuit is disclosed and generally designated 400. The power-on control circuit 400 may be implemented into the system 100 of FIG. 1. Components of the power-on control circuit 400 may correspond to components of the power-on control circuit 200 of FIG. 2, to the components of the power-on control circuit 300 of FIG. 3, or any combination thereof.

The power-on control circuit 400 may include a discharge path 440 configured to provide a path from a level-shifting device 450 to a ground node 485. The discharge path 440 may include a plurality of resistors and transistors. In a particular embodiment, the discharge path 440 includes a first resistor 441, a second resistor 442, a first NMOS 444, and a second NMOS 446. A source of the second NMOS 446 may be coupled to the ground node 485. A drain of the first NMOS 444 may be coupled to the second resistor 442. A source of the first NMOS 444 may be coupled to a drain of the second NMOS 446.

The discharge path 440 may be coupled to a level-shifting device 452 and to a node 402. The discharge path 440 may further be coupled to a capacitor 487. The capacitor 487 may be coupled to the ground node 485.

In operation, the level-shifting device 450 may receive a voltage from a second voltage supply 480 in response to the second supply voltage 480 being powered. The level-shifting device 450 may generate a signal that includes a test input. A portion of the signal generated by the level-shifting device 450 may be discharged via the discharge path 440, e.g. by discharging current to the ground node 485 if a voltage at the node 402 is higher than a threshold voltage associated with the first NMOS 444 and the second NMOS 446.

For example, if the second voltage supply 480 is receiving power, then the signal that includes the test input may be a sufficiently high voltage. Accordingly, gates of the first NMOS 444 and the second NMOS 446 may be activated and a path from the level-shifting device 450 to the ground node 485 may be formed via the first resistor 441, the second resistor 442, the first NMOS 444, and the second NMOS 446.

As will be appreciated, the discharge path 440 of the power detector circuit 400 is operable to pull down the node 402 below the threshold of the power detector 430 quickly (e.g. to a ground level associated with the ground node 485) by a discharge current. The discharge current may behave according to a resistor-capacitor (RC) time constant that is based on the first resistor 441, the second resistor 442, and the capacitor 487.

Figure 5:
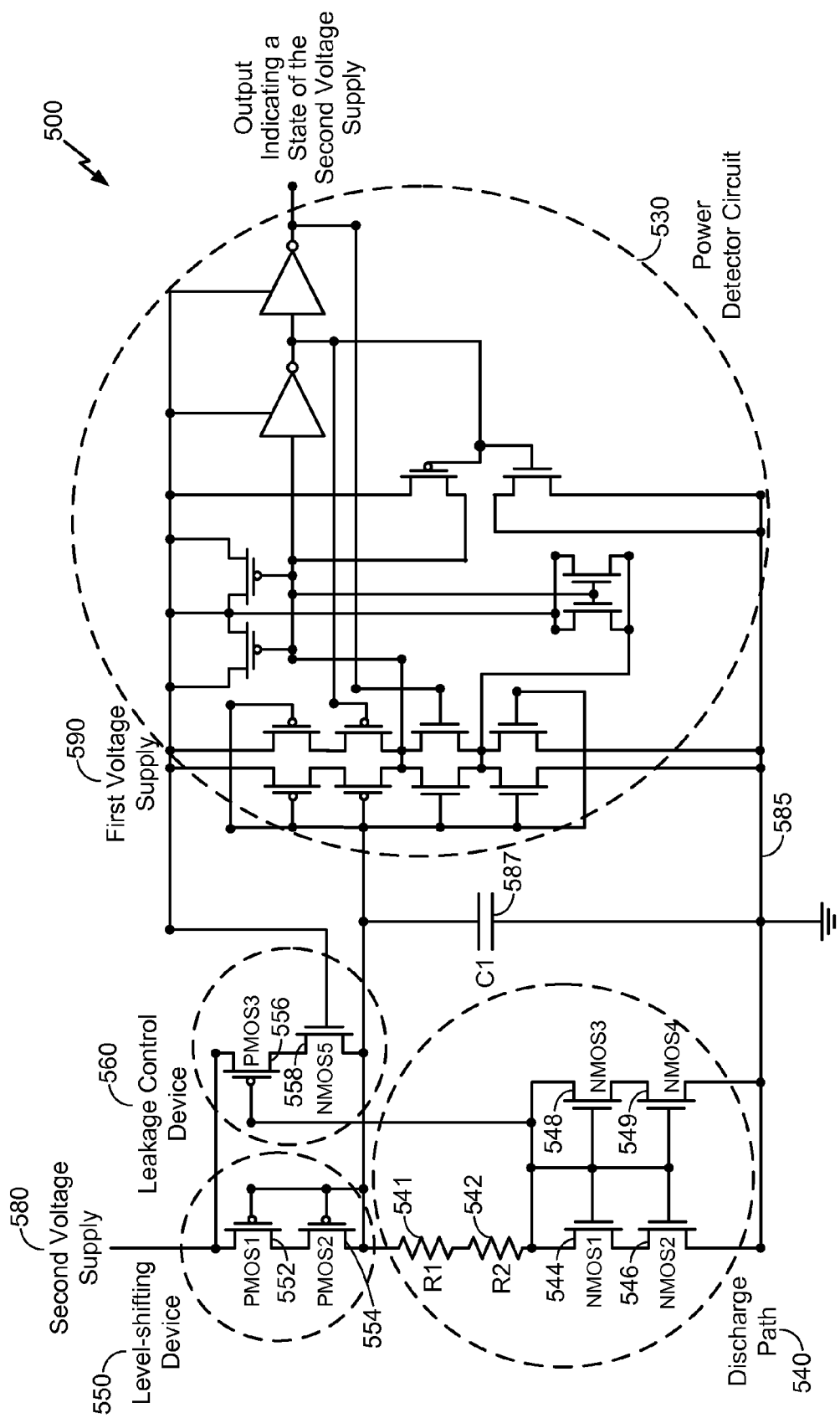
FIG. 5 is a circuit diagram of another particular illustrative embodiment of the power-on control circuit of FIG. 1.

Referring to FIG. 5, a particular illustrative embodiment of a power-on control circuit is disclosed and generally designated 500. The power-on control circuit 500 may be implemented into the system 100 of FIG. 1. Components of the power-on control circuit 500 may correspond to components of the power-on control circuit 200 of FIG. 2, to the components of the power-on control circuit 300 of FIG. 3, to the components of the power-on control circuit 400 of FIG. 4, or any combination thereof.

The power-on control circuit 500 includes a power detector circuit 530, a discharge path 540, a level-shifting device 550, a leakage control device 560, and a ground node 585. The power detector circuit 530 and the leakage control device 560 may be coupled to a first voltage supply 590. The leakage control device 560 and the level-shifting device 550 may be coupled to a second voltage supply 580. The level-shifting device 550, the discharge path 540, and the leakage control device 560 may be coupled to a capacitor 587. The discharge path 540, the capacitor 587, and the power detector circuit 530 may be coupled to the ground node 585.

The level-shifting device 550 may include components operable to step down a voltage supplied by the second voltage supply 580 and provide a test input to the power detector circuit 530. For example, the level-shifting device 550 may include a first PMOS 552 and a second PMOS 554. A source of the first PMOS 552 may be coupled to the second voltage supply 580 and a drain of the first PMOS 552 may be coupled to a source of the second PMOS 554. In a particular embodiment, a gate of the first PMOS 552 is coupled to a gate of the second PMOS 554 and to a drain of the second PMOS 554. The drain of the second PMOS 554 may be coupled to the leakage control device 560 and to the discharge path 540.

The discharge path 540 may include a plurality of resistors and transistors. In a particular embodiment, the discharge path 540 includes a first resistor 541, a second resistor 542, a first NMOS 544, a second NMOS 546, a third NMOS 548, and a fourth NMOS 549. A source of the second NMOS 546 and a source of the fourth NMOS 549 may each be coupled to the ground node 585. A drain of the first NMOS 544 and a drain of the third NMOS 548 may each be coupled to the second resistor 542 and to the leakage control device 560.

The leakage control device 560 may include a plurality of transistors. In a particular embodiment, the leakage control device 560 includes a third PMOS 556 and a fifth NMOS 558. A source of the third PMOS 556 may be coupled to the second voltage supply 580 or to the level-shifting device 550. A source of the fifth NMOS 558 may be coupled to the level-shifting device 550, to the discharge path 540, and to the power detector circuit 530. In a particular embodiment, a gate of the third PMOS 556 is coupled to the discharge path 540 and a gate of the fifth NMOS 558 is coupled to the first voltage supply 590. The source of the fifth NMOS 558 may further be coupled to the capacitor 587.

In operation, the level-shifting device 550 may receive a voltage from the second voltage supply 580. The level-shifting device 550 may attenuate or step down the voltage received from the second voltage supply 580.

A portion of a signal generated by the level-shifting device 550 may be discharged via the discharge path 540. A portion of the signal generated by the level-shifting device 550 may further be discharged via the capacitor 587. The discharge path 540 may behave according to a resistor-capacitor (RC) time constant associated with the capacitor 587, the first resistor 541, and the second resistor 542.

The leakage control device 560 may be gated in part by a voltage level of the first voltage supply 590. In a particular illustrative embodiment, if the first voltage supply 590 is at a high voltage state and the second voltage supply 580 is at a sufficiently high voltage state, then the fifth NMOS 558 is operable to pull up the test input voltage to the power detector 530. For example, the fifth NMOS 558 may pull up, via the third PMOS 556, a node that includes the drain of the first NMOS 544 and the drain of the third NMOS 548.

It will be appreciated that the power-on control circuit 500 of FIG. 5 is operable to pull up (via the leakage control device 560) the test input. The leakage control device 560 may help prevent an unwanted high leakage state in which the second voltage supply 580 is powered but is changing value and might be at an insufficiently high voltage state for the power detector circuit (i.e. by moving above and below a trip voltage associated with transistors of the power detector circuit). By pulling up the test input up to a level of the first voltage supply 590 when the first voltage supply 590 and the second voltage supply 580 are each receiving sufficient power, the high leakage state can be avoided.

It will be further appreciated that the power-on control circuit 500 of FIG. 5 is operable to discharge (via the discharge path 540) the test input. The discharge path 540 may pull down the test input to a low or ground potential when the second voltage supply is not receiving power. When the first voltage supply 590 is not receiving power, the discharge path 540 may reduce current or power consumption, since the fifth NMOS 558 may not couple the test input to the gates of the first NMOS 544, the second NMOS 546, the third NMOS 548, and the fourth NMOS 549. Thus, the discharge path may not further discharge the test input when the first voltage supply 590 is at a low voltage, which may conserve power.

Figure 6:
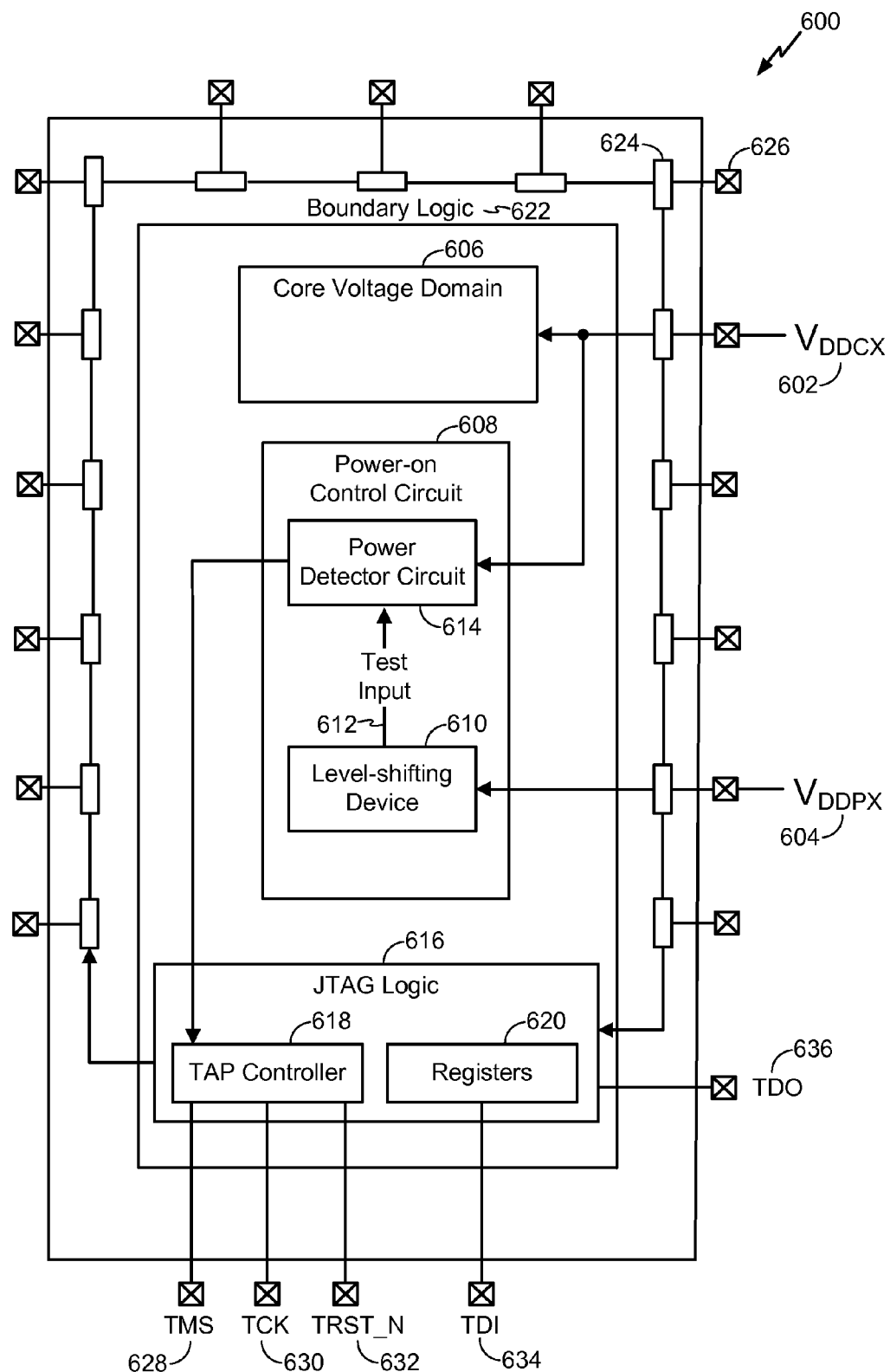
FIG. 6 is a diagram of a particular illustrative embodiment of a semiconductor device including a power-on control circuit.

Referring to FIG. 6, a particular illustrative embodiment of a semiconductor device including a power-on control circuit is disclosed and generally designated 600. The semiconductor device 600 may be implemented using the system 100 of FIG. 1, the power-on control circuit 200 of FIG. 2, the power-on control circuit 300 of FIG. 3, the power-on control circuit 400 of FIG. 4, the power-on control circuit 500 of FIG. 5, or any combination thereof.

The semiconductor device 600 includes a power-on control circuit 608, a core voltage domain 606, boundary logic 622, and Joint Test Action Group (JTAG) logic 616. The power-on control circuit 608 may include a level-shifting device 610 and a power detector circuit 614. The level-shifting device 610 may be coupled to a pad voltage supply 604. The power detector circuit 614 may be coupled to a core voltage supply 602. The level-shifting device 610 may be configured to provide a test input 612 to the power detector circuit 614. In a particular illustrative embodiment, the test input 612 is responsive to a voltage level provided by the pad voltage supply 604. In a particular illustrative embodiment, the core power supply 602 is maintained at about 1.2 volts (V) and the second voltage supply 604 is maintained at about 1.8 V.

Components of the semiconductor device 600 may be associated with one or more of a plurality of voltage domains (e.g. the core voltage domain 606 and a pad voltage domain). In a particular illustrative embodiment, the power-on control circuit 608 and the JTAG logic 616 are integrated onto the core power domain 606.

The boundary logic 622 may comprise a plurality of latching elements (e.g. a plurality of JTAG flip flops 624) and may be coupled to a plurality of pad devices 626. The pad devices 626 may include a test mode select (TMS) input 628, a test clock (TCK) input 630, a test reset (TRST_N) input 632, and a test data in (TDI) input 634. The pad devices may further include a test data out (TDO) output 636.

In a particular embodiment, the JTAG logic 616 includes a test access port (TAP) controller 618 and registers 620. The TAP controller 618 may be coupled to the TMS input 628, to the TCK input 630, and to the TRST_N input 632. The registers 620 may be coupled to the TDI input 634. The JTAG logic 616 may further be configured to provide an output to the TDO output 636. In a particular illustrative embodiment, the TAP controller 618 receives a signal from the power detector circuit 614. The output from the power detector circuit 614 may indicate a state of the pad voltage supply 604.

During operation, the JTAG logic 616 may receive one or more JTAG input signals at one or more of the TMS input 628, the TCK input 630, the TRST_N input 632, and the TDI input 634. The JTAG input signals may be provided by a second semiconductor device separate from the semiconductor device 600 but integrated onto a common circuit board with the semiconductor device 600.

In response to the JTAG input signals, the JTAG logic 616 may initiate a boundary scan of the boundary logic 622. According to a particular illustrative embodiment, the TAP controller 618 initiates the boundary scan at least partially in response to receiving from the power-on control circuit 608 an output that indicates that the pad voltage supply 604 is powered. For example, the pad voltage supply 604 being powered may imply that the boundary logic 622 is functional. The output indicating the state of the pad voltage supply 604 may also reset the TAP controller 618, i.e. inform the TAP controller to place the boundary logic 622 into a functional mode (e.g. a bypass mode) which bypasses the boundary logic 622.

In response to the boundary scan, the JTAG logic 616 may receive one or more inputs from the boundary logic 622 indicating whether various components of the boundary logic 622 are functional. The JTAG logic 616 may then generate a signal indicative of a result of the boundary scan, e.g. at the TDO output 636. In a particular illustrative embodiment, the TDO output 636 is coupled to a third semiconductor device separate from the semiconductor device 600 but integrated onto the common circuit board as the semiconductor device 600.

As will be appreciated, the semiconductor device 600 of FIG. 6 may generate via the power-on control circuit 608 the output responsive to the pad voltage supply 604, including an output that indicates when the pad voltage supply 604 is not powered (or is at a low power level). The output may be utilized to reset the TAP controller 618 independently of the state of the pad voltage supply 604. The output responsive to the pad voltage supply 604 may allow the JTAG logic 616 to operate according to IEEE JTAG standards. For example, the JTAG logic 616 may send control signals to the boundary logic 622 to place the boundary logic 622 in a bypass mode, thereby avoiding undefined functionality associated with executing the boundary scan while the pad voltage supply 604 is unpowered.

Figure 7:
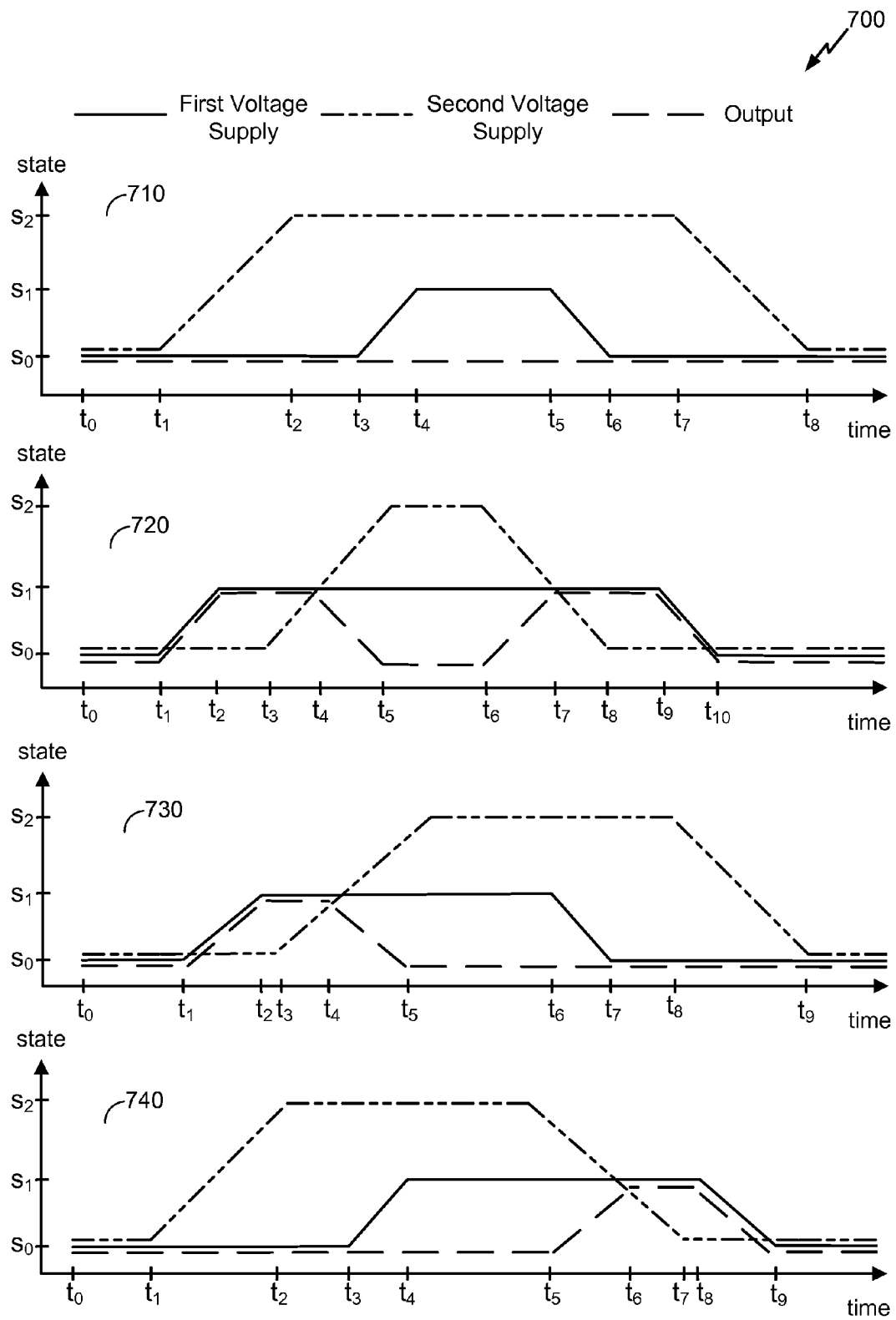
FIG. 7 is a timing diagram associated with operation of the power-on control circuit of FIGS. 2-5.

Referring to FIG. 7, a timing diagram associated with operation of a particular illustrative embodiment of a power-on control circuit is disclosed and generally designated 700. The timing diagram 700 may represent operation of the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof.

The timing diagram 700 illustrates states of a first voltage supply, a second voltage supply, and an output. In a particular illustrative embodiment, the first voltage supply is the first voltage supply 104 of FIG. 1, the second voltage supply is the second voltage supply 108 of FIG. 1, and the output is the output 124 of FIG. 1.

State diagram 710 depicts the first voltage supply, the second voltage supply, and the output initially at state $s_0$ at time $t_0$. At time $t_1$, the second voltage supply receives power and begins to transition upwardly. At time $t_2$, the second voltage supply reaches state $s_2$. At time $t_3$, the first voltage supply begins to transition upwardly. The first voltage supply reaches a state $s_1$ at time $t_4$. From time $t_4$ until time $t_5$, both the second voltage supply and the first voltage supply are at the $s_2$ state and at the $s_1$ state, respectively. At time $t_5$, the first voltage supply beings to transition back to state $s_0$. At time $t_7$, the second voltage supply begins to transition back to state $s_0$. At time $t_8$, the second voltage supply and the first voltage supply are at state $s_0$. The output remains at the $s_0$ state. State diagram 710 depicts that the output remains in a low state in response to a voltage of the first voltage supply not exceeding a voltage of the second voltage supply.

State diagram 720 depicts the second voltage supply, the first voltage supply, and the output in the $s_0$ state at time $t_0$. At time $t_1$, the first voltage supply begins to transition upwardly. The output follows the first voltage supply and begins to transition upwardly. At time $t_2$, the first voltage supply and the output reach the $s_1$ state. At time $t_3$, the second voltage supply begins to transition upwardly. Once the second voltage supply has reached the $s_1$ state at time $t_4$, the output begins to transition downwardly. At time $t_5$, the second voltage supply has reached the $s_2$ state and the output has transitioned to the $s_0$ state. At time $t_6$, the second voltage supply begins to transition downwardly and the output begins to transition upwardly. At time $t_8$, the second voltage supply has reached the $s_0$ state and the output has reached the $s_1$ state. State diagram 720 depicts that the output transitions toward a high state in response to a voltage of the first voltage supply exceeding a voltage of the second voltage supply and that the output transitions toward a low state in response to a voltage of the first voltage supply falling below a voltage of the second voltage supply.

State diagram 730 depicts the second voltage supply, the first voltage supply, and the output in the $s_0$ state at time $t_0$. At time $t_1$, the first voltage supply begins to transition upwardly. The output follows the first voltage supply and begins to transition upwardly. At time $t_2$, the first voltage supply and the output reach the $s_1$ state. At time $t_3$, the second voltage supply begins to transition upwardly. Once the second voltage supply has reached the $s_1$ state at time $t_4$, the output begins to transition downwardly. At time $t_5$, the second voltage supply is in the $s_2$ state, the first voltage supply is in the $s_1$ state, and the output is in the $s_0$ state. State diagram 730 depicts that the output transitions toward a high state in response to a voltage of the first voltage supply exceeding a voltage of the second voltage supply and that the output transitions toward a low state in response to a voltage of the first voltage supply falling below a voltage of the second voltage supply.

State diagram 740 depicts the second voltage supply, the first voltage supply, and the output in the $s_0$ state at time $t_0$. At time $t_1$, the second voltage supply begins to transition to the $s_2$ state. At $t_3$, the first voltage supply begins to transition to the $s_1$ state. At $t_5$, the second voltage supply begins to transition downwardly. Because the first voltage supply is at the $s_1$ state, the output increases to indicate the downward transition of the second voltage supply. At time $t_8$, the first voltage supply begins to transition downward. Because the output is at the $s_2$ state, the output follows the first voltage supply and transitions downwardly. State diagram 740 depicts that the output transitions toward a high state in response to a voltage of the first voltage supply exceeding a voltage of the second voltage supply and that the output transitions toward a low state in response to a voltage of the first voltage supply falling below a voltage of the second voltage supply.

As illustrated in FIG. 7, the output has a first logical level (i.e. the state $s_0$) in response to a first voltage of the first voltage supply exceeding a first threshold (i.e. the state $s_0$) and a second voltage of the second voltage supply exceeding a second threshold (i.e. the state $s_2$). The first threshold associated with the first voltage supply may be less than the second threshold of the second voltage supply.

The output may transition from a second logical level (i.e. the state $s_1$) to a first logical level (i.e. the state $s_0$) in response to a second voltage of the second voltage supply transitioning from below a second threshold (i.e. the state $s_1$) to above the second threshold (i.e. the state $s_1$) while a first voltage of the first voltage supply exceeds a first threshold (i.e. the state $s_1$).

The output may also transition from a first logical level (i.e. the state $s_0$) to a second logical level (i.e. the state $s_1$) in response to the second voltage of the second voltage supply transitioning from above a second threshold (i.e. the state $s_1$) to below the second threshold (i.e. the state $s_2$).

It will be appreciated that FIG. 7 depicts states of a first voltage supply (e.g. a core voltage supply) and a second voltage supply (e.g. a pad voltage supply) and an output that indicates a state of the second voltage supply.

Figure 8:
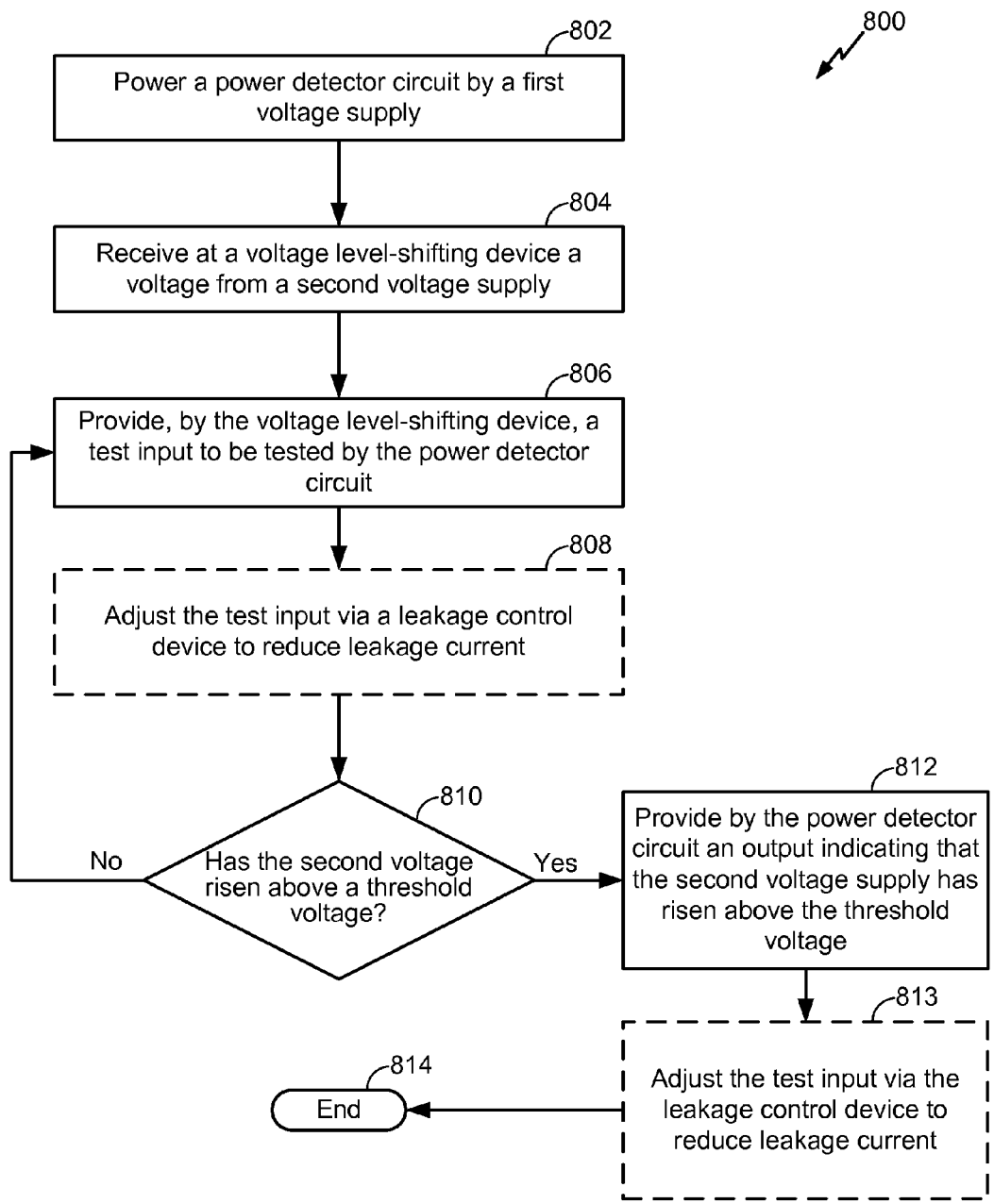
FIG. 8 is a flow diagram of a particular illustrative embodiment of a method of operation of a power-on control circuit.

Referring to FIG. 8, a particular illustrative embodiment of a method of determining a state of a voltage supply is disclosed and generally designated 800.

The method 800 includes powering a power detector circuit by a first voltage supply, as shown at 802. In a particular illustrative embodiment, the first voltage supply is the first voltage supply 104 of FIG. 1.

Continuing to 804, the method 800 includes receiving at a voltage level-shifting device a voltage from a second voltage supply. In a particular illustrative embodiment, the second voltage supply is the second voltage supply 108 of FIG. 1.

Continuing to 806, the method 800 includes providing, by the voltage level-shifting device, a test input to be tested by the power detector circuit. In a particular illustrative embodiment, the test input is the test input 128 of FIG. 1.

Continuing to 808, the method 800 may optionally include adjusting the test input via a leakage control device to reduce leakage current. In a particular illustrative embodiment, the leakage control device is the leakage control device 160 of FIG. 1. The leakage control device may be configured to reduce leakage current associated with the first voltage supply, the second voltage supply, or a combination thereof, as described herein with reference to FIG. 5.

At 810, it is determined whether the second voltage supply has risen above a threshold voltage. If the second voltage has risen above the threshold voltage, the method 800 includes providing by the power detector circuit an output indicating that the second voltage supply has risen above the threshold voltage, at 812.

Continuing to 813, the method 800 may optionally include adjusting the test input via the leakage control device to reduce leakage current. In a particular illustrative embodiment, the leakage control device is configured to reduce leakage current associated with the first voltage supply, the second voltage supply, or a combination thereof. The method 800 may then terminate, at 814.

As will be appreciated, a computer readable tangible medium may be provided that stores instructions executable by a computer to determine whether a power detector circuit powered by a first voltage supply has received a test input from at least one voltage level-shifting device coupled to a second voltage supply. The test input may indicate to the computer that the second voltage supply is powered. In a particular illustrative embodiment, the computer includes a test access port (TAP) controller.

The method 800 of FIG. 8 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 800 of FIG. 8 can be performed by a processor that executes instructions, as described with respect to FIG. 9.

Figure 9:
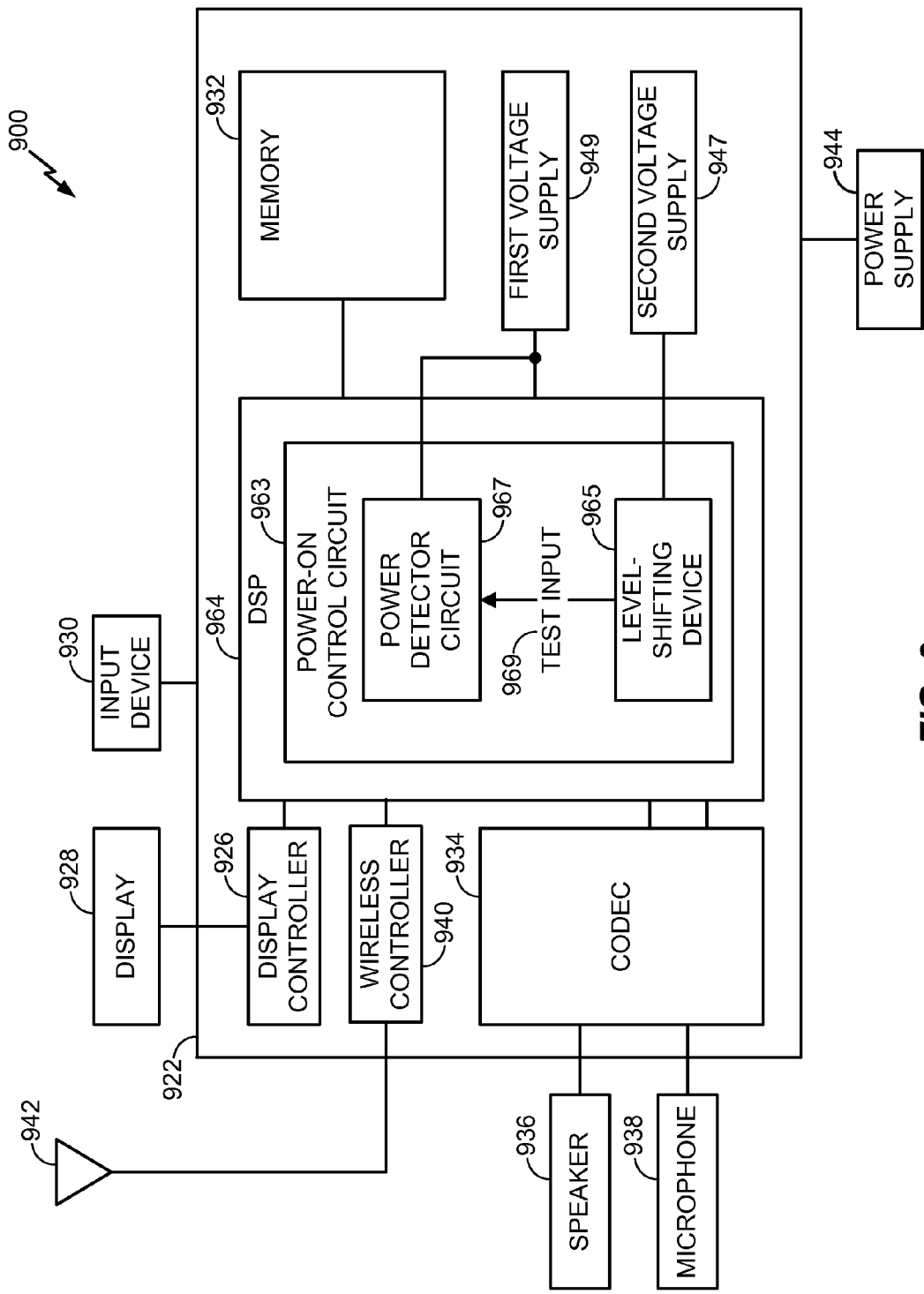
FIG. 9 is a diagram of a particular illustrative embodiment of an electronic portable device including a power-on control circuit.

Referring to FIG. 9, a block diagram of a particular illustrative embodiment of a wireless communication device is depicted and generally designated 900. The device 900 includes a processor, such as a digital signal processor (DSP) 964, coupled to a memory 932. The device 900 further includes a power-on control circuit 963. In an illustrative embodiment, the power-on control circuit 963 may correspond to the power-on control circuit 102 of FIG. 1, the power-on control circuit 200 of FIG. 2, the power-on control circuit 300 of FIG. 3, the power-on control circuit 400 of FIG. 4, the power-on control circuit 500 of FIG. 5, the power-on control circuit 608 of FIG. 6, or may operate according to the timing diagrams 700 of FIG. 7 or the method 800 of FIG. 8, or any combination thereof.

The power-on control circuit 963 includes a power detector circuit 967 coupled to a first voltage supply 949. The power-on control circuit 963 may also include a level-shifting device 965 coupled to a second voltage supply 947. The level-shifting device 965 may be operable to provide a test input 969 to the power detector circuit 967. In a particular illustrative embodiment, the first voltage supply 949 and the second voltage supply 947 are supplied power via the power supply 944.

FIG. 9 also shows a display controller 926 that is coupled to the digital signal processor 964 and to a display 928. A coder/decoder (CODEC) 934 can also be coupled to the digital signal processor 964. A speaker 936 and a microphone 938 can be coupled to the CODEC 934.

FIG. 9 also indicates that a wireless controller 940 can be coupled to the digital signal processor 964 and to a wireless antenna 942. In a particular embodiment, the DSP 964, the display controller 926, the memory 932, the CODEC 934, and the wireless controller 940 are included in a system-in-package or system-on-chip device 922. In a particular embodiment, an input device 930 and a power supply 944 are coupled to the system-on-chip device 922. Moreover, in a particular embodiment, as illustrated in FIG. 9, the display 928, the input device 930, the speaker 936, the microphone 938, the wireless antenna 942, and the power supply 944 are external to the system-on-chip device 922. However, each of the display 928, the input device 930, the speaker 936, the microphone 938, the wireless antenna 942, and the power supply 944 can be coupled to a component of the system-on-chip device 922, such as an interface or a controller.

In conjunction with the described embodiments, a system is disclosed that may include means for detecting voltages, such as the power detector circuit 120 of FIG. 1, the power detector circuit 276 of FIG. 2, the power detector circuit 376 of FIG. 3, the power detector circuit 430, of FIG. 4, the power detector circuit 530 of FIG. 5, the power detector circuit 614 of FIG. 6, or any combination thereof. The system may also include means for means for stepping down voltages, such as the level-shifting device 116 of FIG. 1, the level-shifting device 272 of FIG. 2, the level-shifting device 372 of FIG. 3, the level-shifting device 450 of FIG. 4, the level-shifting device 550 of FIG. 5, the level-shifting device 610 of FIG. 6, or any combination thereof.

In conjunction with the described embodiments, a method is disclosed that may include a step for step for powering a power detector circuit by a first voltage supply, such as the power detector circuit 120 of FIG. 1, the power detector circuit 276 of FIG. 2, the power detector circuit 376 of FIG. 3, the power detector circuit 430, of FIG. 4, the power detector circuit 530 of FIG. 5, the power detector circuit 614 of FIG. 6, or any combination thereof. The method may also include a step for receiving at a voltage level-shifting device a voltage from a second voltage supply, such as the level-shifting device 116 of FIG. 1, the level-shifting device 272 of FIG. 2, the level-shifting device 372 of FIG. 3, the level-shifting device 450 of FIG. 4, the level-shifting device 550 of FIG. 5, the level-shifting device 610 of FIG. 6, or any combination thereof. The method may further include a step for providing, by the voltage level-shifting device, a test input to the power detector circuit, such as the test input 612 of FIG. 6.

Figure 10:
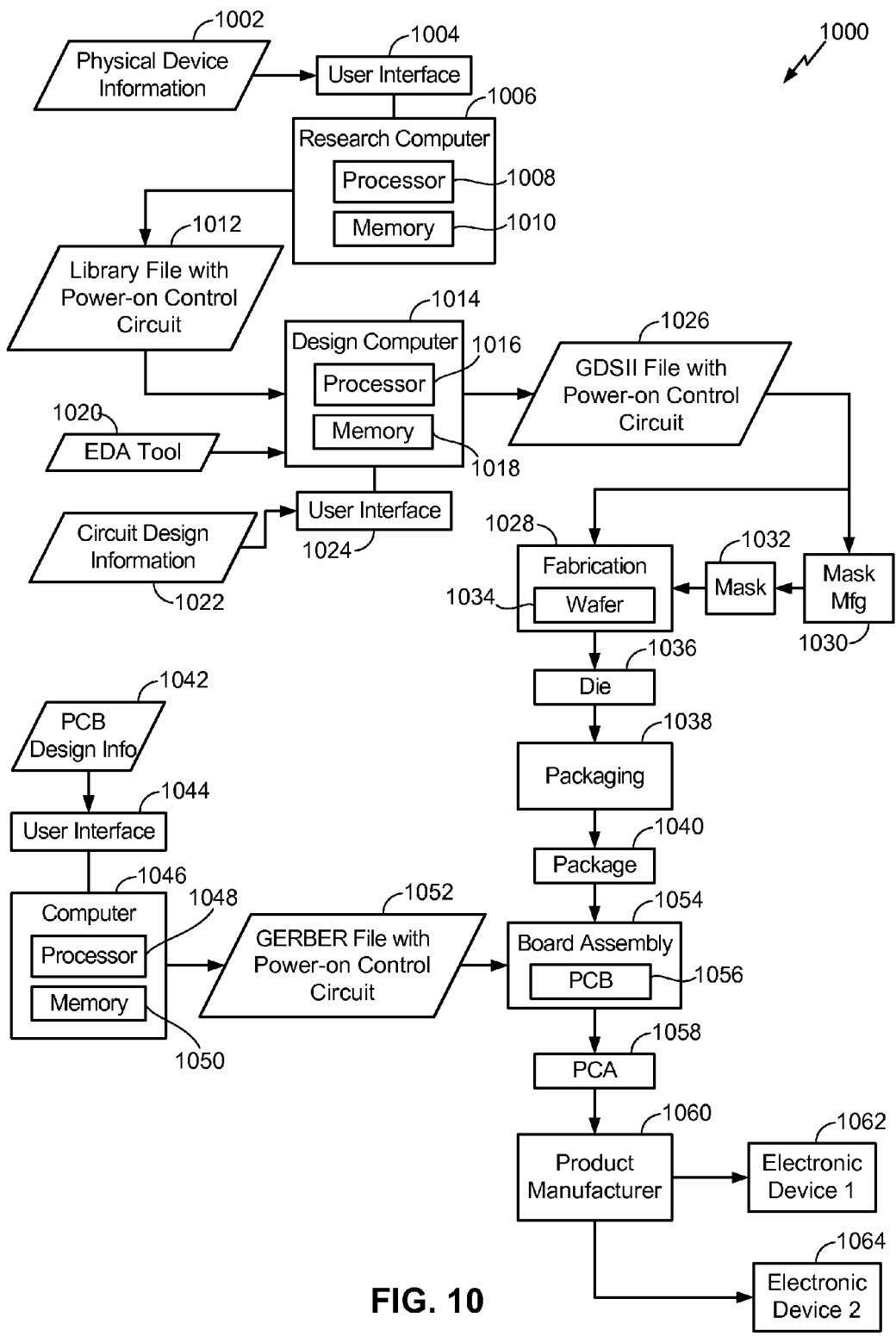
FIG. 10 is a data flow diagram of a particular illustrative embodiment of a manufacturing process to manufacture electronic devices that include a power-on control circuit.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 10 depicts a particular illustrative embodiment of an electronic device manufacturing process 1000.

Physical device information 1002 is received at the manufacturing process 1000, such as at a research computer 1006. The physical device information 1002 may include design information representing at least one physical property of a semiconductor device, such as the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof. For example, the physical device information 1002 may include physical parameters, material characteristics, and structure information that is entered via a user interface 1004 coupled to the research computer 1006. The research computer 1006 includes a processor 1008, such as one or more processing cores, coupled to a computer readable medium such as a memory 1010. The memory 1010 may store computer readable instructions that are executable to cause the processor 1008 to transform the physical device information 1002 to comply with a file format and to generate a library file 1012.

In a particular embodiment, the library file 1012 includes at least one data file including the transformed design information. For example, the library file 1012 may include a library of semiconductor devices including a device that includes the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof, that is provided for use with an electronic design automation (EDA) tool 1020.

The library file 1012 may be used in conjunction with the EDA tool 1020 at a design computer 1014 including a processor 1016, such as one or more processing cores, coupled to a memory 1018. The EDA tool 1020 may be stored as processor executable instructions at the memory 1018 to enable a user of the design computer 1014 to design a circuit including the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof, of the library file 1012. For example, a user of the design computer 1014 may enter circuit design information 1022 via a user interface 1024 coupled to the design computer 1014. The circuit design information 1022 may include design information representing at least one physical property of a semiconductor device, such as the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof. To illustrate, the circuit design property may include identification of particular circuits and relationships to other elements in a circuit design, positioning information, feature size information, interconnection information, or other information representing a physical property of a semiconductor device.

The design computer 1014 may be configured to transform the design information, including the circuit design information 1022, to comply with a file format. To illustrate, the file formation may include a database binary file format representing planar geometric shapes, text labels, and other information about a circuit layout in a hierarchical format, such as a Graphic Data System (GDSII) file format. The design computer 1014 may be configured to generate a data file including the transformed design information, such as a GDSII file 1026 that includes information describing the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof, in addition to other circuits or information. To illustrate, the data file may include information corresponding to a system-on-chip (SOC) that includes the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof, and that also includes additional electronic circuits and components within the SOC.

The GDSII file 1026 may be received at a fabrication process 1028 to manufacture the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof, according to transformed information in the GDSII file 1026. For example, a device manufacture process may include providing the GDSII file 1026 to a mask manufacturer 1030 to create one or more masks, such as masks to be used with photolithography processing, illustrated as a representative mask 1032. The mask 1032 may be used during the fabrication process to generate one or more wafers 1034, which may be tested and separated into dies, such as a representative die 1036. The die 1036 includes a circuit including a device that includes the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof.

The die 1036 may be provided to a packaging process 1038 where the die 1036 is incorporated into a representative package 1040. For example, the package 1040 may include the single die 1036 or multiple dies, such as a system-in-package (SiP) arrangement. The package 1040 may be configured to conform to one or more standards or specifications, such as Joint Electron Device Engineering Council (JEDEC) standards.

Information regarding the package 1040 may be distributed to various product designers, such as via a component library stored at a computer 1046. The computer 1046 may include a processor 1048, such as one or more processing cores, coupled to a memory 1050. A printed circuit board (PCB) tool may be stored as processor executable instructions at the memory 1050 to process PCB design information 1042 received from a user of the computer 1046 via a user interface 1044. The PCB design information 1042 may include physical positioning information of a packaged semiconductor device on a circuit board, the packaged semiconductor device corresponding to the package 1040 including the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof.

The computer 1046 may be configured to transform the PCB design information 1042 to generate a data file, such as a GERBER file 1052 with data that includes physical positioning information of a packaged semiconductor device on a circuit board, as well as layout of electrical connections such as traces and vias, where the packaged semiconductor device corresponds to the package 1040 including the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof. In other embodiments, the data file generated by the transformed PCB design information may have a format other than a GERBER format.

The GERBER file 1052 may be received at a board assembly process 1054 and used to create PCBs, such as a representative PCB 1056, manufactured in accordance with the design information stored within the GERBER file 1052. For example, the GERBER file 1052 may be uploaded to one or more machines to perform various steps of a PCB production process. The PCB 1056 may be populated with electronic components including the package 1040 to form a representative printed circuit assembly (PCA) 1058.

The PCA 1058 may be received at a product manufacture process 1060 and integrated into one or more electronic devices, such as a first representative electronic device 1062 and a second representative electronic device 1064. As an illustrative, non-limiting example, the first representative electronic device 1062, the second representative electronic device 1064, or both, may be selected from the group of a set top box, a music player, a video player, an entertainment unit, a navigation device, a communications device, a personal digital assistant (PDA), a fixed location data unit, and a computer, into which the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof, is integrated. As another illustrative, non-limiting example, one or more of the electronic devices 1062 and 1064 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 10 illustrates remote units according to teachings of the disclosure, the disclosure is not limited to these illustrated units. Embodiments of the disclosure may be suitably employed in any device which includes active integrated circuitry including memory and on-chip circuitry.

A device that includes the system 100 of FIG. 1, the power-on control circuit 200 of FIG. 2, the power-on control circuit 300 of FIG. 3, the power-on control circuit 400 of FIG. 4, the power-on control circuit 500 of FIG. 5, the semiconductor device 600 of FIG. 6, or any combination thereof, may be fabricated, processed, and incorporated into an electronic device, as described in the illustrative process 1000. One or more aspects of the embodiments disclosed with respect to FIGS. 1-10 may be included at various processing stages, such as within the library file 1012, the GDSII file 1026, and the GERBER file 1052, as well as stored at the memory 1010 of the research computer 1006, the memory 1018 of the design computer 1014, the memory 1050 of the computer 1046, the memory of one or more other computers or processors (not shown) used at the various stages, such as at the board assembly process 1054, and also incorporated into one or more other physical embodiments such as the mask 1032, the die 1036, the package 1040, the PCA 1058, other products such as prototype circuits or devices (not shown), or any combination thereof. Although various representative stages of production from a physical device design to a final product are depicted, in other embodiments fewer stages may be used or additional stages may be included. Similarly, the process 1000 may be performed by a single entity or by one or more entities performing various stages of the process 1000.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a power detector circuit powered by a first voltage supply;
at least one voltage level-shifting device coupled to a second voltage supply and configured to provide a test input to the power detector circuit;
a discharge path to enable a discharge of an input of the power detector circuit, wherein the discharge path comprises a first resistor, a second resistor, a first n-type metal-oxide-semiconductor (NMOS) transistor, and a second NMOS transistor; and
wherein the power detector circuit is configured to determine a logical status of the second voltage supply based on the test input and to provide an output indicating the logical status.

2. The apparatus of claim 1, wherein the at least one voltage level-shifting device is configured to step down a voltage of the second voltage supply.

3. The apparatus of claim 2, wherein the power detector circuit is configured to provide the output having a first logical level in response to a first voltage of the first voltage supply exceeding a first threshold and a second voltage of the second voltage supply exceeding a second threshold.

4. The apparatus of claim 3, wherein the first threshold of the first voltage supply is less than the second threshold of the second voltage supply.

5. The apparatus of claim 2, wherein the power detector circuit is further configured to transition the output from a second logical level to a first logical level in response to a second voltage of the second voltage supply transitioning from below a second threshold to above the second threshold while a first voltage of the first voltage supply exceeds a first threshold.

6. The apparatus of claim 5, wherein the power detector circuit is further configured to transition the output from the first logical level to the second logical level in response to the second voltage of the second voltage supply transitioning from above the second threshold to below the second threshold.

7. The apparatus of claim 1, wherein the discharge path further comprises a third NMOS transistor and a fourth NMOS transistor, wherein a gate of the first NMOS transistor is coupled to a gate of the third NMOS transistor, and wherein a gate of the second NMOS transistor is coupled to a gate of the fourth NMOS transistor.

8. The apparatus of claim 1, integrated in at least one semiconductor die.

9. The apparatus of claim 1, further comprising at least one of: a set top box, a music player, a video player, an entertainment unit, a navigation device, a communications device, a personal digital assistance (PDA), a fixed location data unit, or a computer, into which the power detector circuit and the at least one voltage level-shifting device are integrated.

10. An apparatus comprising:
a power detector circuit powered by a first voltage supply;
at least one voltage level-shifting device coupled to a second voltage supply and configured to provide a test input to the power detector circuit;
a leakage control device powered by the second voltage supply and responsive to a voltage level of the first voltage supply; and
wherein the power detector circuit is configured to determine a logical status of the second voltage supply based on the test input and to provide an output indicating the logical status.

11. The apparatus of claim 10, wherein the leakage control device comprises an n-type metal-oxide-semiconductor (NMOS) transistor, wherein a gate of the NMOS transistor is coupled to the first voltage supply, and wherein a source of the NMOS transistor is coupled to the power detector circuit.

12. An apparatus comprising:
means for detecting voltages, wherein the means for detecting voltages is powered by a first voltage supply;
means for stepping down voltages, wherein the means for stepping down voltages is coupled to a second voltage supply and is configured to step down a voltage of the second voltage supply and provide a test input to the means for detecting voltages responsive to the second voltage supply;
boundary logic, wherein the boundary logic comprises a plurality of latching elements; and
wherein the means for detecting voltages is configured to reference the test input to determine a logical status of the second voltage supply and to provide an output indicating the logical status.

13. The apparatus of claim 12, further comprising Joint Test Action Group (JTAG) logic coupled to the boundary logic, wherein the JTAG logic is configured to perform a boundary scan of the plurality of latching elements.

14. The apparatus of claim 13, wherein the JTAG logic comprises a test access port (TAP) controller, and wherein the TAP controller is configured to receive a reset signal from the means for detecting voltages.

15. The apparatus of claim 12, integrated in at least one semiconductor die.

16. The apparatus of claim 12, further comprising at least one of: a set top box, a music player, a video player, an entertainment unit, a navigation device, a communications device, a personal digital assistance (PDA), a fixed location data unit, or a computer, into which the means for detecting voltages and the means for stepping down voltages are integrated.

17. An apparatus comprising:
means for detecting voltages, wherein the means for detecting voltages is powered by a first voltage supply;
means for stepping down voltages, wherein the means for stepping down voltages is coupled to a second voltage supply and is configured to step down a voltage of the second voltage supply and provide a test input to the means for detecting voltages responsive to the second voltage supply; and a plurality of input/output (I/O) buffers coupled to a pad voltage supply.

18. A method comprising:
powering a power detector circuit by a first voltage supply;
receiving at a voltage level-shifting device a voltage from a second voltage supply;
providing, by the voltage level-shifting device, a test input to the power detector circuit;
referencing the test input with the power detector circuit to detect whether the second voltage supply meets a threshold voltage;
determining a logical status of the second voltage supply in response to the test input and providing an output indicating the logical status;
outputting a first output from the power detector circuit that indicates that the second voltage supply has reached the threshold voltage; and
wherein the power detector circuit provides the first output to a test access port (TAP) controller.

19. The method of claim 18, wherein powering the power detector circuit and providing the test input are performed by a processor integrated into an electronic device.

20. The method of claim 18, wherein the first output transitions from a high voltage to a low voltage.

21. The method of claim 18, further comprising outputting a second output from the power detector circuit that indicates that the second voltage supply has fallen below the threshold voltage.

22. The method of claim 21, wherein the second output transitions from a low voltage to a high voltage.

23. A power-on control circuit comprising:
a power detector circuit coupled to a core voltage supply;
a voltage level-shifting device coupled to a pad voltage supply and configured to provide a test input to the power detector circuit, wherein the voltage level-shifting device is configured to step down a voltage of the pad voltage supply;
a buffer stage coupled to the power detector circuit and to the core voltage supply;
Joint Test Action Group (JTAG) logic coupled to the buffer stage; and
wherein the buffer stage is configured to provide an output indicating a state of the pad voltage supply.

24. The power-on control circuit of claim 23, wherein the JTAG logic comprises a test access port (TAP) controller, and wherein the buffer stage is configured to provide the output to the TAP controller.

25. The power-on control circuit of claim 23, further comprising boundary logic, wherein the boundary logic comprises a plurality of JTAG latching elements, and wherein the JTAG logic is configured to perform a boundary scan of the boundary logic.

26. The power-on control circuit of claim 23, wherein the power detector circuit, the voltage level-shifting device, and the buffer stage are integrated onto a voltage domain.

27. The power-on control circuit of claim 23, further comprising at least one of: a set top box, a music player, a video player, an entertainment unit, a navigation device, a communications device, a personal digital assistance (PDA), a fixed location data unit, or a computer, into which the power detector circuit and the voltage level-shifting device are integrated.

28. A method, comprising:
a first step for powering a power detector circuit with a first voltage supply;
a second step for receiving at a voltage level-shifting device a voltage from a second voltage supply and stepping down the voltage;
a third step for providing, with the voltage level-shifting device, a test input to the power detector circuit; and
a fourth step for determining, at a test access port (TAP) controller, whether the second voltage supply is powered.

29. The method of claim 28, wherein the first step, the second step, and the third step are performed by a processor integrated into an electronic device.

* * * * *